(12) United States Patent
Park et al.

(10) Patent No.: US 12,312,528 B2
(45) Date of Patent: May 27, 2025

(54) ETCHANT COMPOSITION AND MANUFACTURING METHOD OF DISPLAY DEVICE USING THE SAME

(71) Applicant: Samsung Display Co., Ltd., Yongin-si (KR)

(72) Inventors: Jong Hee Park, Hwaseong-si (KR); Hyoung Sik Kim, Seoul (KR); Sang Hyuk Lee, Incheon (KR); Yong Hoe Kim, Incheon (KR); Young Kwang Kim, Incheon (KR); Dong Ho Kang, Incheon (KR); Hyun-Cheol Shin, Incheon (KR); Sung-Tae Kim, Cheonan-si (KR); Dong Hun Lee, Asan-si (KR); Min Hye Lee, Pyeongtaek-si (KR); Byung Su Lee, Gwangmyeong-si (KR); Ki Su Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 556 days.

(21) Appl. No.: 17/826,064

(22) Filed: May 26, 2022

(65) Prior Publication Data

US 2022/0380668 A1     Dec. 1, 2022

(30) Foreign Application Priority Data

May 27, 2021  (KR) .................. 10-2021-0068430

(51) Int. Cl.
| | | |
|---|---|---|
| C09K 13/06 | (2006.01) | |
| H10K 50/81 | (2023.01) | |
| H10K 59/121 | (2023.01) | |
| H10K 59/131 | (2023.01) | |
| H10K 71/00 | (2023.01) | |

(Continued)

(52) U.S. Cl.
CPC ............. *C09K 13/06* (2013.01); *H10K 50/81* (2023.02); *H10K 59/1216* (2023.02); *H10K 59/131* (2023.02); *H10K 71/00* (2023.02); *H10K 71/621* (2023.02); H10K 59/1201 (2023.02); H10K 2102/103 (2023.02)

(58) Field of Classification Search
None
See application file for complete search history.

(56) References Cited

U.S. PATENT DOCUMENTS

2015/0004758 A1\* 1/2015 Choung ............ H01L 21/32134
252/79.3

FOREIGN PATENT DOCUMENTS

| KR | 10-0993775 | 11/2010 |
|---|---|---|
| KR | 10-1518055 | 5/2015 |
| KR | 10-2018-0103535 | 9/2018 |

(Continued)

*Primary Examiner* — Kyoung Lee
(74) *Attorney, Agent, or Firm* — KILE PARK REED & HOUTTEMAN PLLC

(57) ABSTRACT

An etchant composition includes: an inorganic acid compound at 9.0 wt % to 9.9 wt %; an inorganic salt compound at 5.0 wt % to 10.0 wt %; an organic acid compound at 35 wt % to 45 wt %; a lactate-based compound at 10 wt % to 20 wt %; a nitrogen cyclic compound containing oxygen at 0.1 wt % to 1.0 wt %; and a remaining amount of water such that a total weight of the etchant composition is 100 wt %, wherein the inorganic acid compound is an etchant composition having an acid dissociation constant (pKa) value of −1.0 to −3.0.

20 Claims, 11 Drawing Sheets

(51) Int. Cl.
*H10K 59/12* (2023.01)
*H10K 102/10* (2023.01)

(56) References Cited

FOREIGN PATENT DOCUMENTS

KR  10-2019-0058759  5/2019
KR  10-2020-0055195  5/2020

* cited by examiner

ETCHANT COMPOSITION AND MANUFACTURING METHOD OF DISPLAY DEVICE USING THE SAME

CROSS-REFERENCE TO RELATED APPLICATION

This application claims priority from and benefit of Korean Patent Application No. 10-2021-0068430, filed on May 27, 2021 which is hereby incorporated by reference for all purposes as if fully set forth herein.

BACKGROUND

Field

Embodiments of the invention relate generally to an etchant composition and a manufacturing method of a display device using the same.

Discussion of the Background

As a display device, a liquid crystal display (LCD), an organic light emitting diode display (OLED), and the like are used.

Such a display device includes a plurality of metal patterns. These metal patterns require effects such as improvement of conductivity or reduction of contact resistance, and through this, a stable image is to be realized.

The metal pattern may include a structure in which a plurality of layers made of different materials are stacked in order to achieve the above-described effects.

The above information disclosed in this Background section is only for understanding of the background of the inventive concepts, and, therefore, it may contain information that does not constitute prior art.

SUMMARY

Devices constructed and methods performed according to illustrative implementations of the invention are capable of negating a silver reducing particle precipitation phenomenon that may otherwise adversely affect operation of such devices.

Embodiments have been made in an effort to provide an etchant composition for selectively etching a metal layer including silver (Ag) among multilayer films including different materials, and a method of manufacturing a display device using the same.

Additional features of the inventive concepts will be set forth in the description which follows, and in part will be apparent from the description, or may be learned by practice of the inventive concepts.

An embodiment provides an etchant composition including: an inorganic acid compound at 9.0 wt % to 9.9 wt %; an inorganic salt compound at 5.0 wt % to 10.0 wt %; an organic acid compound at 35 wt % to 45 wt %; a lactate-based compound at 10 wt % to 20 wt %; a nitrogen cyclic compound containing oxygen at 0.1 wt % to 1.0 wt %; and a remaining amount of water such that a total weight of the etchant composition is 100 wt %, wherein the inorganic acid compound is an etchant composition having an acid dissociation constant (pKa) value of −1.0 to −3.0.

The lactate-based compound may include at least one of mandelic acid ($C_8H_8O_3$), phenylacetic acid ($C_8H_8O_2$), valeric acid ($C_5H_{10}O_2$), lauric acid ($C_{12}H_{24}O_2$), propionic acid ($C_3H_6O_2$), butyric acid ($C_3H_7COOH$), glycolic acid ($C_2H_4O_3$), sodium lactate ($C_3H_5NaO_3$), 3-hydroxypropionic acid ($C_3H_6O_3$), or lactic acid ($C_3H_6O_3$).

The inorganic salt compound may have a reduction potential value of 0.5 V to 1.0V.

The nitrogen cyclic compound including oxygen may include at least one of uric acid ($C_5H_4N_4O_3$), iprodione ($C_{13}H_{13}Cl_2N_3O$), cytosine ($C_4H_5N_3O$), guanine ($C_5H_5N_5O$), thymine ($C_5H_6N_2O_2$), hydantoin ($C_3H_4N_2O_2$), oxazole ($C_3H_3NO$), 1H-benzotriazole-1-methanol ($C_7H_7N_3O$), 3-nitro-1H-1,2,4-triazole ($C_2H_2N_4O_2$), benzoxazole ($C_7H_5NO$), isothiazolinone ($C_3H_3NOS$), succinimide ($C_4H_5NO_2$), or glutarimide ($C_5H_7NO_2$).

The inorganic acid compound may include at least one of nitric acid ($HNO_3$), sulfuric acid ($H_2SO_4$), p-toluenesulfonic acid ($CH_3C_6H_4SO_3$), or chloric acid ($HClO_3$).

The inorganic salt compound may include at least one of ammonium nitrate ($NH_4NO_3$), sodium nitrate ($NaNO_3$), potassium nitrate ($KNO_3$), copper nitrate ($Cu(NO_3)_2$), ferric nitrate ($Fe(NO_3)_3$), magnesium nitrate ($Mg(NO_3)_2$), or zinc nitrate ($ZnNO_3$).

The etchant composition may include at least two different inorganic salt compounds.

The organic acid compound may include at least one of acetic acid ($CH_3CO_2H$), malic acid ($C_4H_6O_5$), citric acid ($C_6H_8O_7$), tartaric acid ($C_4H_6O_6$), formic acid ($CH_2O_2$), succinic acid ($C_4H_6O_4$), fumaric acid ($C_4H_4O_4$), sulfonic acid ($CH_4O_3S$), methane sulfonic acid ($CH_3SO_3H$), aminomethylsulfonic acid ($CH_5NO_3S$), or sulfamic acid ($H_3NSO_3$).

The etchant composition may include at least two or more different organic acid compounds.

A weight ratio of the inorganic salt compound to the nitrogen cyclic compound containing oxygen may be 1:0.02 to 1:0.2.

A weight ratio of the lactate-based compound to the nitrogen cyclic compound containing oxygen may be 1:0.005 to 1:0.1.

An embodiment provides a manufacturing method of a display device, including: forming a transistor on a substrate; forming a first electrode to be electrically connected to the transistor, wherein the first electrode has a stacked structure of a first conductive layer, a second conductive layer containing silver (Ag), and a third conductive layer, the second conductive layer is etched by an etchant composition, the etchant composition includes: an inorganic acid compound at 9.0 wt % to 9.9 wt %; an inorganic salt compound at 5.0 wt % to 10.0 wt %; an organic acid compound at 35 wt % to 45 wt %; a lactate-based compound at 10 wt % to 20 wt %; a nitrogen cyclic compound containing oxygen at 0.1 wt % to 1.0 wt %; and a remaining amount of water such that a total weight of the etchant composition is 100 wt %; and etching the inorganic acid compound by use of an etchant composition having an acid dissociation constant (pKa) value of −1.0 to −3.0. The substrate may include a display area and a non-display area, it may further include forming a signal line positioned on the non-display area, and the signal line may include: a first layer containing titanium; a second layer containing aluminum; and a third layer containing titanium.

The first conductive layer and the third conductive layer may include an ITO, and may not be etched by the etchant composition.

According to the embodiments, it is possible to provide an etchant composition in which an etchant does not contain phosphoric acid, for selectively etching a portion of a multilayer film including different materials, particularly one layer including silver (Ag), and a manufacturing method of a display device using the same. In addition, it is possible to provide an etchant composition for forming a fine wire and a manufacturing method of a display device using the same. It is also possible to prevent silver precipitation during a manufacturing process using the etchant composition. Of course, the scope of the present invention is not limited by these effects.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
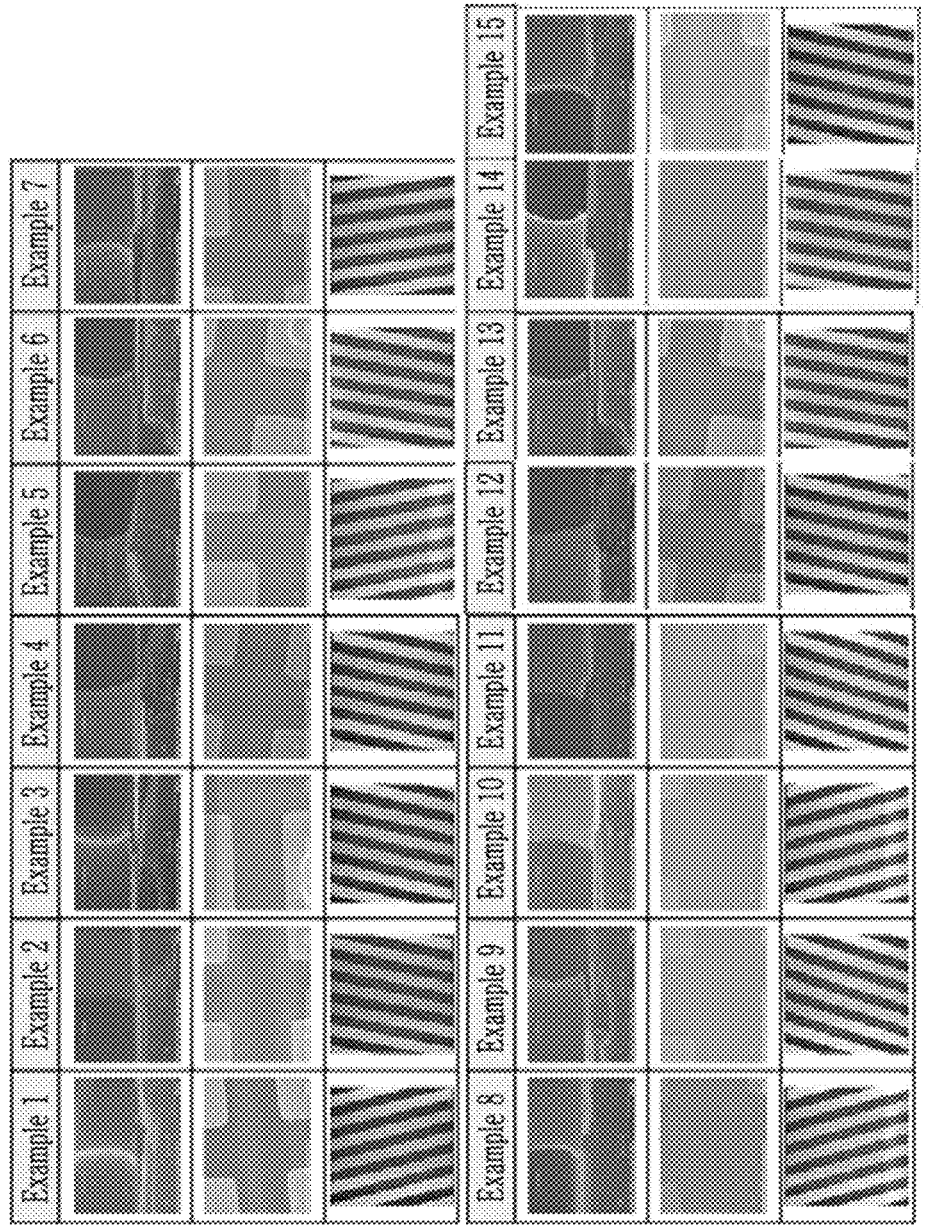
FIG. 1 illustrates a scope and SEM photograph of a triple film (ITO/Ag/ITO) and a photoresist pattern etched with an etchant composition of Examples 1 to 15.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, in the specification, the phrase "in a plan view" connotes when an object portion is viewed from above, and the phrase "in a cross-sectional view" connotes when a cross-section taken by vertically cutting an object portion is viewed from the side.

An etchant composition according to the present invention may be used to etch a single layer made of silver (Ag) or a silver alloy.

The etchant composition according to an embodiment may include an inorganic acid compound, an inorganic salt compound, an organic acid compound, a lactate-based compound, a nitrogen cyclic compound containing oxygen, and the remainder of water.

The inorganic acid compound may be a main oxidizing agent for silver (Ag). As an example, the inorganic acid compound may include at least one of nitric acid ($HNO_3$), sulfuric acid ($H_2SO_4$), p-toluenesulfonic acid ($CH_3C_6H_4SO_3$), or chloric acid ($HClO_3$), and may be used alone or in combination of two or more.

The inorganic acid compound may be included at 9.0 to 9.9 wt %, e.g., 9.5 to 9.8 wt %, based on a total weight of the etchant composition. When a content of the inorganic acid compound is higher than 9.9 wt %, an etching rate is too high to control an etching degree, and thus the metal layer including silver may be overetched. When the content of the inorganic acid compound is lower than 9.0 wt %, the etching rate may decrease, and thus sufficient etching may not be performed.

An acid dissociation constant (pKa) of the inorganic acid compound may be −1.0 to −3.0. In this case, the acid dissociation constant value in the present specification is a value based on 25 degrees Celsius. The acid dissociation constant is an equilibrium constant of is ionization equilibrium of an acid, and is a measure indicating strength of an acid, and the larger the value, the greater the ionization tendency. When an inorganic acid compound with an acid dissociation constant of −1.0 or higher is used, silver residue may occur, and when using an inorganic acid compound with an acid dissociation constant of −3.0 or less of the inorganic acid compound, silver overetching may occur.

The inorganic salt compound may increase the etching rate of silver, and may be an auxiliary oxidizing agent for silver. The etchant composition according to an embodiment may include at least two different inorganic salt compounds. For example, the inorganic salt compound may include a nitrate. The inorganic salt compound may include at least one of ammonium nitrate ($NH_4NO_3$), sodium nitrate ($NaNO_3$), potassium nitrate ($KNO_3$), copper nitrate ($Cu(NO_3)_2$), ferric nitrate ($Fe(NO_3)_3$), magnesium nitrate ($Mg(NO_3)_2$), or zinc nitrate ($ZnNO_3$), and may be used alone or in combination of two or more.

The inorganic salt compound may be included at 5 to 10 wt %, e.g., 7 to 8 wt %, based on a total weight of the etchant composition. When a content of the inorganic salt compound is higher than 10 wt %, an etching rate of silver becomes excessively high, and thus a CD skew may be excessively formed beyond a specification range of 0.25 micrometers to 0.35 micrometers. When the content of the inorganic salt compound is lower than 5 wt %, the etching rate of silver may be excessively lowered and residues may be generated.

A reduction potential value of the inorganic salt compound is a value based on the reduction potential of 0 V of hydrogen, and refers to a value expressing a property of a molecule to be reduced by receiving electrons as a voltage. The inorganic salt compound may have a reduction potential value of 0.5 V to 1.0 V, or 0.6 V to 0.9 V, and more specifically, 0.7 V to 0.8 V. When it is lower than the reduction potential value, Ag residues are likely to occur, and when is it is higher than the reduction potential value, overetching of Ag may occur.

The organic acid compound may include at least two different organic acid compounds. The organic acid compound may be used as an etchant to etch silver oxidized by an inorganic acid compound.

For example, the organic acid compound may include at least one of acetic acid ($CH_3CO_2H$), malic acid ($C_4H_6O_5$), citric acid ($C_6H_8O_7$), tartaric acid ($C_4H_6O_6$), formic acid ($CH_2O_2$), succinic acid ($C_4H_6O_4$), fumaric acid ($C_4H_4O_4$), sulfonic acid ($CH_4O_3S$), methane sulfonic acid ($CH_3SO_3H$), aminomethylsulfonic acid ($CH_5NO_3S$), or sulfamic acid ($H_3NSO_3$), and may be used alone or in combination of two or more.

The organic salt compound may be included at 35 to 45 wt %, e.g., 38 to 43 wt %, based on a total weight of the etchant composition. When a weight of the organic acid compound is higher than 45 wt %, an etching rate of the silver film is excessively high, and thus CD skew may cause erosion defects beyond a specification range of 0.25 micrometers to 0.35 micrometers. When the weight of the organic acid compound is lower than 35 wt %, the etching rate may be slow, and residues may be generated, and stability of the etchant composition may be deteriorated.

The lactate-based compound, which is an auxiliary etchant, may increase the etching rate of silver, and may prevent generation of silver film residues. When a metal layer containing silver is etched by using an inorganic acid compound, the inorganic acid compound may be decomposed to deteriorate etching performance, but the lactate-based compound may slow a decomposition rate of the inorganic acid compound, thereby maintaining a constant etching rate of the metal layer including silver.

For example, the lactate-based compound may include at least one of mandelic acid ($C_8H_8O_3$), phenylacetic acid ($C_8H_8O_2$), valeric acid ($C_5H_{10}O_2$), lauric acid ($C_{12}H_{24}O_2$), propionic acid ($C_3H_6O_2$), butyric acid ($C_3H_7COOH$), glycolic acid ($(C)_2H_4O_3$), sodium lactate ($C_3H_5NaO_3$), 3-hydroxypropionic acid ($C_3H_6O_3$), or lactic acid ($C_3H_6O_3$), and may be used alone or in combination of two or more.

The lactate-based compound may be included at 10 to 20 wt %, e.g., 14 to 18 wt %, based on a total weight of the etchant composition. When a weight of the lactate-based compound is higher than 20 wt %, an etching rate of the silver film is excessively high, and thus CD skew may cause erosion defects beyond a specification range of 0.25 micrometers to 0.35 micrometers, while when it is lower than 10 wt %, a decomposition inhibitory effect on the inorganic acid compound may be reduced, and thus stability may be deteriorated, and residues may be generated.

The nitrogen cyclic compound containing oxygen, which is an etch control agent for silver, may prevents excessive CD skew formation during wiring formation, and may controls a CD skew change depending on a silver concentration to not occur.

For example, the nitrogen cyclic compound including oxygen may include at least one of uric acid ($C_5H_4N_4O_3$), iprodione ($C_{13}H_{13}Cl_2N_3O_3$), cytosine ($C_4H_5N_3O$), guanine ($C_5H_5N_5O$), thymine ($(C)_5H_6N_2O_2$), hydantoin ($C_3H_4N_2O_2$), oxazole ($C_3H_3NO$), 1H-benzotriazole-1-methanol ($C_7H_7N_3O$), 3-nitro-1H-1,2,4-triazole ($C_2H_2N_4O_2$), benzoxazole ($C_7H_5NO$), isothiazolinone ($C_3H_3NOS$), succinimide ($(C)_4H_5NO_2$), or glutarimide ($C_5H_7NO_2$), and may be used alone or in combination of two or more.

The nitrogen cyclic compound including oxygen may be included at 0.1 to 1.0 wt %, e.g., 0.3 to 0.8 wt %, based on a total weight of the etchant composition. When a content of the nitrogen cyclic compound including oxygen is higher than 1.0 wt %, an etching rate of silver (Ag) is slowed, resulting in residues, while when it is less than 0.1 wt %, a CD skew may be excessively formed beyond a specification range of 0.25 micrometers to 0.35 micrometers, and silver overetching may occur.

A weight ratio of the inorganic salt compound to the nitrogen cyclic compound containing oxygen may be 1:0.02 to 1:0.2. When it exceeds the above range, residues may occur, while when it is less than the above range, overetching may occur.

A weight ratio of the lactate-based compound to the nitrogen cyclic compound containing oxygen may be 1:0.005 to 1:0.1. When it exceeds the above range, residues may occur, while when it is less than the above range, overetching may occur.

In the etchant composition, water may be included so that a sum of wt % of other constituent elements except water and wt % of water becomes 100 wt %. As water used in the etchant composition, semiconductor grade water or ultra-pure water may be used.

The etchant composition according to an embodiment may not include a phosphoric acid-based compound, but may include a lactate-based compound to etch silver (Ag), and may not include a sulfate-based compound to selectively etch only silver (Ag). Only a metal layer including silver (Ag) among the multilayers may be selectively etched by using such an etchant composition.

Hereinafter, the present invention will be described in more detail through examples. However, the following examples are provided to describe the present invention in more detail, and the scope of the present invention is not limited by the following examples. The following examples may be appropriately modified and changed by those skilled in the art within the scope of the present invention.

<Preparation of Etchant Composition>

Etchants of Examples 1 to 15 and Comparative Examples 1 to 13 depending on the etchant composition as described above were prepared as shown in Table 1 below. % in Table 1 below indicates wt %.

TABLE 1

| | Organic acid compound (%) | Lactate compound (%) | Inorganic acid compound (%) | Inorganic salt compound (%) | Nitrogen cyclic compound containing nitrogen (%) | Phosphoric acid compound (%) | Acid dissociation constant (pKa) | Inorganic salt compound reduction potential (V) |
|---|---|---|---|---|---|---|---|---|
| Example 1 | 40 | 15 | 9.5 | 7.5 | 0.5 | 0 | −2 | 0.8 |
| Example 2 | 35 | 15 | 9.5 | 7.5 | 0.5 | 0 | −2 | 0.5 |
| Example 3 | 45 | 15 | 9.5 | 7.5 | 0.5 | 0 | −2 | 1.0 |
| Example 4 | 40 | 10 | 9.5 | 7.5 | 0.5 | 0 | −2 | 0.8 |
| Example 5 | 40 | 20 | 9.5 | 7.5 | 0.5 | 0 | −2 | 0.8 |
| Example 6 | 40 | 15 | 9.0 | 7.5 | 0.5 | 0 | −1.5 | 0.8 |
| Example 7 | 40 | 15 | 9.9 | 7.5 | 0.5 | 0 | −2.5 | 0.8 |
| Example 8 | 40 | 15 | 9.5 | 5.0 | 0.5 | 0 | −2 | 0.8 |
| Example 9 | 40 | 15 | 9.5 | 10.0 | 0.5 | 0 | −2 | 0.8 |
| Example 10 | 40 | 15 | 9.5 | 7.5 | 0.1 | 0 | −2 | 0.8 |
| Example 11 | 40 | 15 | 9.5 | 7.5 | 1.0 | 0 | −2 | 0.8 |
| Example 12 | 40 | 15 | 9.5 | 5.0 | 0.1 | 0 | −2 | 0.8 |
| Example 13 | 40 | 15 | 9.5 | 5.0 | 1.0 | 0 | −2 | 0.8 |
| Example 14 | 40 | 15 | 9.5 | 5.0 | 0.05 | 0 | −2 | 0.8 |
| Example 15 | 40 | 15 | 9.5 | 5.0 | 1.5 | 0 | −2 | 0.8 |
| Comparative Example 1 | 34 | 15 | 9.5 | 7.5 | 0.5 | 0 | −2 | 0.8 |
| Comparative Example 2 | 46 | 15 | 9.5 | 7.5 | 0.5 | 0 | −2 | 1.3 |

TABLE 1-continued

| | Organic acid compound (%) | Lactate compound (%) | Inorganic acid compound (%) | Inorganic salt compound (%) | Nitrogen cyclic compound containing nitrogen (%) | Phosphoric acid compound (%) | Acid dissociation constant (pKa) | Inorganic salt compound reduction potential (V) |
|---|---|---|---|---|---|---|---|---|
| Comparative Example 3 | 40 | 9 | 9.5 | 7.5 | 0.5 | 0 | −2 | 0.3 |
| Comparative Example 4 | 40 | 21 | 9.5 | 7.5 | 0.5 | 0 | −2 | 0.8 |
| Comparative Example 5 | 40 | 15 | 8.5 | 7.5 | 0.5 | 0 | 0 | 0.8 |
| Comparative Example 6 | 40 | 15 | 10.5 | 7.5 | 0.5 | 0 | −3.5 | 0.8 |
| Comparative Example 7 | 40 | 15 | 9.5 | 4.5 | 0.5 | 0 | −2 | 0.8 |
| Comparative Example 8 | 40 | 15 | 9.5 | 10.5 | 0.5 | 0 | −2 | 0.8 |
| Comparative Example 9 | 40 | 15 | 9.5 | 7.5 | 0 | 0 | −2 | 0.8 |
| Comparative Example 10 | 40 | 15 | 9.5 | 7.5 | 1.5 | 0 | −2 | 0.8 |
| Comparative Example 11 | 40 | 15 | 9.5 | 7.5 | 0.5 | 1 | −2 | 0.8 |
| Comparative Example 12 | 40 | 15 | 9.5 | 7.5 | 1.5 | 0 | −4 | 0.8 |
| Comparative Example 13 | 40 | 15 | 9.5 | 7.5 | 1.5 | 0 | 1 | 0.8 |

All of Examples 1 to 15 and Comparative Examples 1 to 10, 12, and 13 are etchant compositions free of phosphoric acid-based compounds, and exhibit excellent effects in terms of precipitation. When the phosphoric acid-based compound is contained as in Comparative Example 11, there is a problem in that silver (Ag) is precipitated. Examples 12 and 13 show very excellent etching performance when an optimum ratio of the inorganic salt compound and the nitrogen cyclic compound containing oxygen is 1:0.02 and 1:0.2. On the other hand, when the ratio of the inorganic salt compound and the nitrogen cyclic compound containing oxygen becomes 1:0.01 and 1:0.3 beyond 1:0.02 to 1:0.2, which is the optimum ratio, a phenomenon occurred that an etching characteristic decreased compared to the optimum ratio occurrence.

In Comparative Examples 5, 6, 12, and 13, when a pKA value did not satisfy a range of −1 to −3, there was a problem in the etching characteristic. When the pKA value was −3 or less, overetching of silver (Ag) occurred, and when the pKA value was −1 or more, an etching ability of silver (Ag) was reduced.

As in Comparative Example 1, Comparative Example 3, Comparative Example 5, and Comparative Example 7, when the content of each compound is lower than in the examples, the etching ability for silver is lowered to generate residues. In addition, as in Comparative Example 2, Comparative Example 4, Comparative Example 6, and Comparative Example 8, when a content of each compound is higher than in the examples, the etching ability for silver is improved to excessively form a CD skew. In Comparative Example 9, the content of the nitrogen cyclic compound containing oxygen is reduced compared to the examples, and the etching ability for silver is improved to excessively form a CD skew and to reduce stability of the etchant, showing very weak results in CD skew control, a cumulative number of sheets, or aging. In Comparative Example 10, the content of the nitrogen cyclic compound containing oxygen is increased compared to that of the examples, and a residue is generated by blocking the etching ability of silver.

Experimental Example 1

Etching Rate of Etchant, CD Skew, Residue, and Precipitation Measurement

Figure 2:
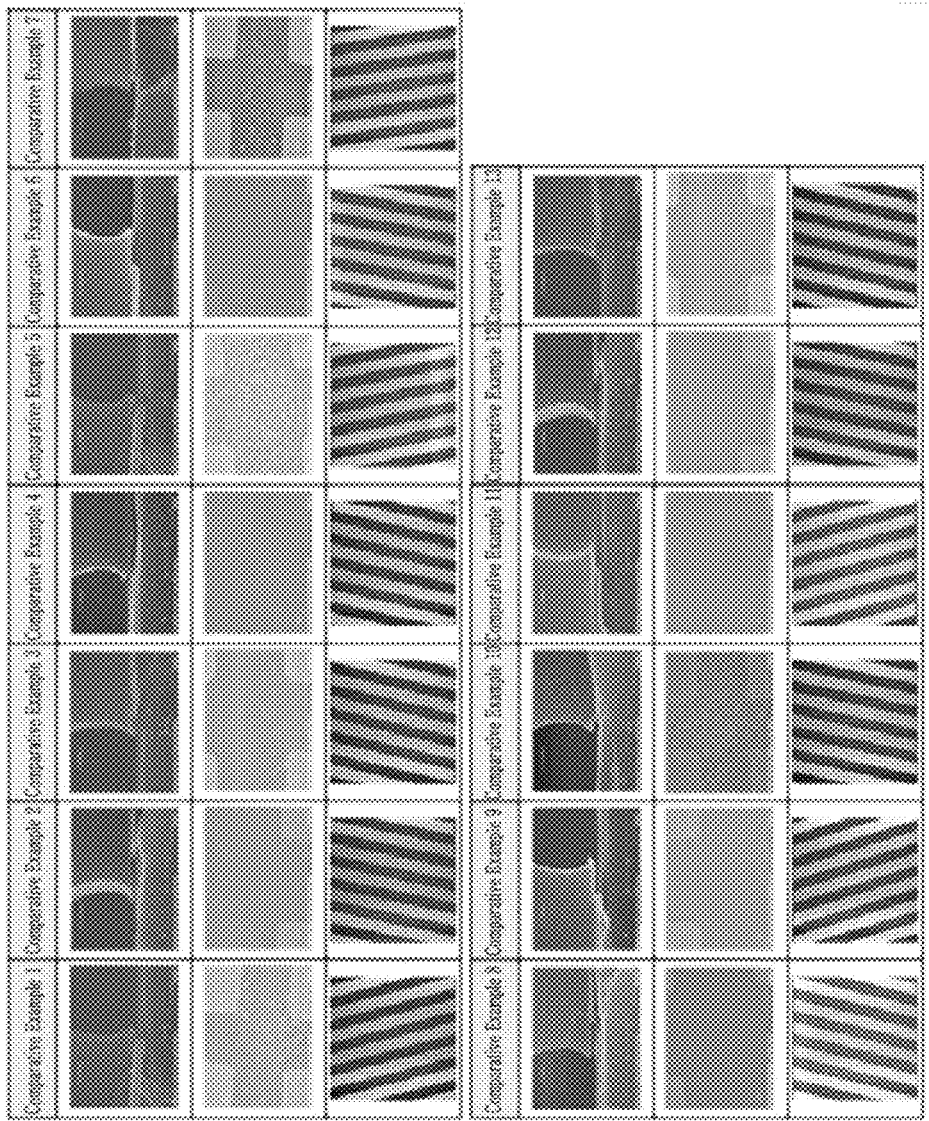
FIG. 2 illustrates a scope and SEM photograph of a triple film (ITO/Ag/ITO) and a photoresist pattern etched with an etchant composition of Comparative Examples 1 to 13.

Table 2 below shows results of etching with the etchant compositions of Examples 1 to 15 and Comparative Examples 1 to 13 in a state in which a photoresist pattern is formed on a multilayer metal layer having a stacked structure of ITO/Ag/ITO. FIG. 1 illustrates images of the examples, and FIG. 2 illustrates images of the comparative examples.

In Table 2 below, a silver etch rate (Ag E/R) of 400 Ê/s to 450 Ê/s is an appropriate etching rate. CD skew (cut dimension skew) indicates a distance between a tip of a photoresist pattern and a tip of silver, and an appropriate range thereof is 0.25 μm to 0.35 μm. Residues and precipitation should not exist even in trace amounts.

TABLE 2

| | Etching characteristic | | | |
|---|---|---|---|---|
| | Ag E/R(Å/sec) | CD-Skew(μm) | Residue | Precipitation |
| Example 1 | 431 | 0.28 | Non-exist | Non-exist |
| Example 2 | 419 | 0.33 | Non-exist | Non-exist |
| Example 3 | 447 | 0.29 | Non-exist | Non-exist |
| Example 4 | 421 | 0.30 | Non-exist | Non-exist |
| Example 5 | 439 | 0.33 | Non-exist | Non-exist |
| Example 6 | 411 | 0.28 | Non-exist | Non-exist |
| Example 7 | 450 | 0.29 | Non-exist | Non-exist |
| Example 8 | 425 | 0.30 | Non-exist | Non-exist |
| Example 9 | 438 | 0.31 | Non-exist | Non-exist |
| Example 10 | 440 | 0.27 | Non-exist | Non-exist |
| Example 11 | 408 | 0.28 | Non-exist | Non-exist |
| Example 12 | 435 | 0.30 | Non-exist | Non-exist |
| Example 13 | 432 | 0.28 | Non-exist | Non-exist |
| Example 14 | 400 | 0.35 | Non-exist | Non-exist |
| Example 15 | 450 | 0.25 | Non-exist | Non-exist |
| Comparative Example 1 | 350 | 0.17 | Exist | Non-exist |

TABLE 2-continued

| | Etching characteristic | | | |
|---|---|---|---|---|
| | Ag E/R(Å/sec) | CD-Skew(μm) | Residue | Precipitation |
| Comparative Example 2 | 530 | 0.50 | Non-exist | Non-exist |
| Comparative Example 3 | 385 | 0.20 | Exist | Non-exist |
| Comparative Example 4 | 491 | 0.49 | Non-exist | Non-exist |
| Comparative Example 5 | 381 | 0.17 | Exist | Non-exist |
| Comparative Example 6 | 488 | 0.50 | Non-exist | Non-exist |
| Comparative Example 7 | 379 | 0.14 | Exist | Non-exist |
| Comparative Example 8 | 491 | 0.51 | Non-exist | Non-exist |
| Comparative Example 9 | 534 | 0.49 | Non-exist | Non-exist |
| Comparative Example 10 | 323 | 0.11 | Exist | Non-exist |
| Comparative Example 11 | 445 | 0.30 | Non-exist | Exist |
| Comparative Example 12 | 500 | 0.51 | Non-exist | Exist |
| Comparative Example 13 | 330 | 015 | Exist | Exist |

Referring to Table 2, the etchants according to Examples 1 to 11 and Comparative Example 11 satisfy the reference range with a silver etch rate (Ag E/R) of 400 to 450 Å/s. In addition, a CD skew of 0.25 μm to 0.35 μm is satisfied, and the residue is also satisfied, but Comparative Example 11 includes a phosphate-based compound, so silver precipitation occurs. In Examples 12 and 13, in the case of 1:0.02 and 1:0.2, which are the optimal ratios of the inorganic salt compound and the nitrogen cyclic compound containing oxygen, the etch rate (Ag E/R) satisfies a reference range from 400 to 450 Å/s, satisfies the CD skew of 0.25 μm to 0.35 μm, and also satisfies a residue. On the other hand, in Examples 14 and 15, when the ratio of the inorganic salt compound and the nitrogen cyclic compound containing oxygen becomes 1:0.01 and 1:0.3 beyond 1:0.02 to 1:0.2, which is the optimum ratio, a phenomenon occurred that an etching characteristic is decreased compared to the optimum ratio occurs.

Comparative Examples 1, 3, 5, 7, and 10 do not satisfy an appropriate range in all characteristics except for precipitation, and Comparative Example 11 does not satisfy an appropriate range in all characteristics except the residue. Comparative Examples 2, 4, 6, 8, and 9 satisfy the characteristics in the residue and the precipitation, but the silver etch rate and the CD skew do not satisfy the reference range.

In the case of the etchants according to Examples 1 to 15 and Comparative Examples 2, 4, 6, 8, and 9, as shown in Table 2, it can be seen that when the silver etching compositions are in a sufficient range, no residue is generated, but when the silver etch composition is contained within a certain range, a reference of the CD skew is not satisfied due to excessive etching.

Figure 3:
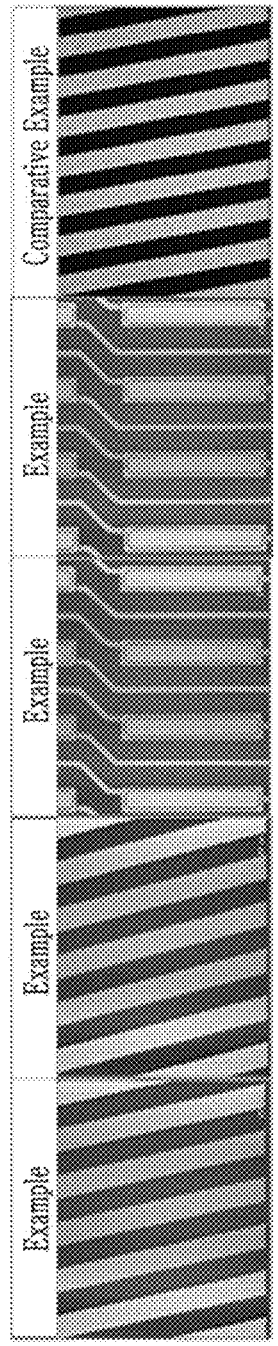
FIG. 3 illustrates an image of a pad portion according to examples and a comparative example.

In addition, as illustrated in FIG. 3, it is seen that silver (Ag) particles are not precipitated in the pad portion according to the examples, and silver (Ag) particles are precipitated according to the comparative examples.

Experimental Example 3

Reliability Evaluation Depending on an Increase in a Number of Etchants Treated

Table 3 below shows evaluation of a number of substrates treated as follows by increasing a silver ion concentration with respect to the etchant according to Example 1. Specifically, after reference etching was performed using the etchant of Example 1, 400 ppm of silver powder was added to evaluate the etching characteristic. In the table below, ◎ indicates a case where an amount of change compared to the reference is within 10%.

TABLE 3

| | Ref | 400 ppm | 800 ppm | 1200 ppm | 1600 ppm | 2000 ppm |
|---|---|---|---|---|---|---|
| Ag EPD | ◎ | ◎ | ◎ | ◎ | ◎ | ◎ |
| CD skew | ◎ | ◎ | ◎ | ◎ | ◎ | ◎ |
| Residue | ◎ | ◎ | ◎ | ◎ | ◎ | ◎ |
| Precipitation | ◎ | ◎ | ◎ | ◎ | ◎ | ◎ |

Referring to Table 3, it can be seen that, in the etchant composition according to an embodiment, changes in the etching rate, CD skew, residue, and precipitation are not large even when the silver ion concentration is increased. It is seen that reliability of the etchant composition is excellent even when a number of etchings is increased.

Experimental Example 4

Reliability Evaluation Depending on an Increase in a Number of Etchants Treated

Table 4 below shows results of an etching test performed while increasing a lapse of time for the etchant according to Example 1. Specifically, reference etching was performed using the etchant of Example 1, and the etching test was performed with a time lapse of 4 h. In the table below, ◎ indicates a case where an amount of change compared to the reference is within 10%.

TABLE 4

| | Ref | 4 h | 8 h | 12 h | 16 h | 20 h | 24 h |
|---|---|---|---|---|---|---|---|
| Ag EPD | ◎ | ◎ | ◎ | ◎ | ◎ | ◎ | ◎ |
| CD skew | ◎ | ◎ | ◎ | ◎ | ◎ | ◎ | ◎ |
| Residue | ◎ | ◎ | ◎ | ◎ | ◎ | ◎ | ◎ |
| Precipitation | ◎ | ◎ | ◎ | ◎ | ◎ | ◎ | ◎ |

Figure 4:
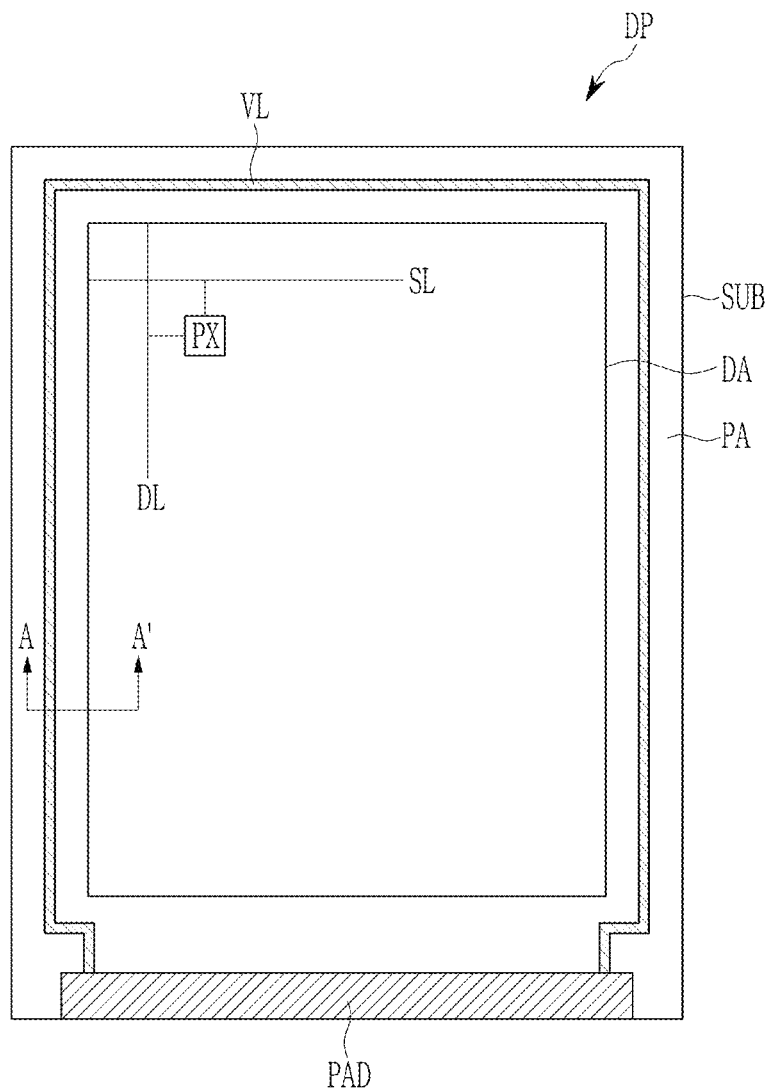
FIG. 4 illustrates a schematic top plan view of a display device according to an embodiment.
Figure 5:
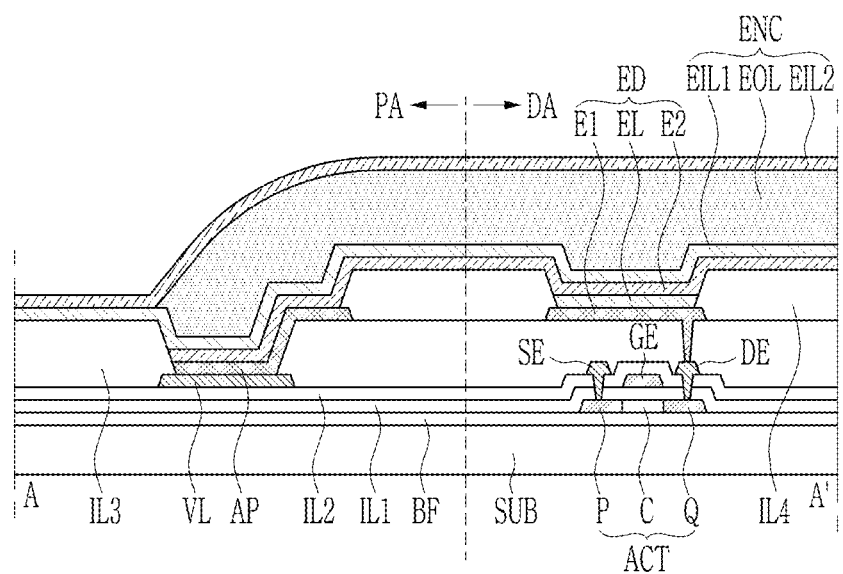
FIG. 5 illustrates a cross-sectional view taken along a line A-A' of FIG. 4.

Referring to Table 4, it can be seen that, in the etchant composition according to an embodiment, changes in the etching rate, CD skew, residue, and precipitation are not large even when the time lapse is increased. It can be seen that the etchant composition has excellent etching reliability. A display device according to an embodiment will now be described with reference to FIG. 4 and FIG. 5. FIG. 4 illustrates a schematic top plan view of a display device according to an embodiment, and FIG. 5 illustrates a cross-sectional view taken along a line A-A' of FIG. 4.

First, as illustrated in FIG. 4, the display device DP displays an image on a front surface thereof. The front surface of the display device DP includes a display area DA and a non-display area PA. The image is displayed in the display area DA. The non-display area PA may be positioned to surround a periphery of the display area DA.

The display device DP may include a plurality of pixels PX positioned in the display area DA. The pixels PX may display light in response to an electrical signal. Lights displayed by the pixels PX may implement an image. A number of transistors included in one pixel PX, a number of capacitors, and a connection relationship thereof may be variously modified.

The display device DP includes the pixels PX. The pixels PX may be positioned in the display area DA on the substrate SUB. Each of the pixels PX includes a light emitting element and a driving circuit unit connected thereto. Each of the pixels PX emits, e.g., red, green, blue, or white light, and may include, e.g., an organic light emitting diode.

The display device DP may include a plurality of signal lines and a pad portion. The signal lines may include a scan line SL extending in a first direction (e.g., a horizontal direction) and a data line DL extending in a second direction (e.g., a vertical direction).

The display device DP includes a substrate including a display area DA and a non-display area PA. The non-display area PA may be defined along an edge of the display area DA.

The pad portion PAD may be positioned at one end of the non-display area PA, to transfer an electrical signal from a power supply device or a signal generator to the display area DA. A signal line VL for supplying power to the pixel PX may be positioned in the non-display area PA.

Referring to a cross-section of the display area DA with reference to FIG. 5, the substrate SUB may have various degrees of flexibility. The substrate SUB may be a rigid substrate or a flexible substrate capable of bending, folding, rolling, or the like.

The substrate SUB may include a glass material or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate SUB may have a multilayered structure including a layer including the aforementioned polymer resin and an inorganic layer.

A buffer layer BF may be disposed on the substrate SUB. The buffer layer BF may prevent impurities from being transferred from the substrate SUB to an upper layer of the buffer layer BF, particularly a semiconductor layer ACT, thereby preventing deterioration of a characteristic of the semiconductor layer ACT and reducing stress. The buffer layer BF may be a single layer or multiple layers including at least one of a silicon oxide ($SiO_x$), a silicon nitride ($SiN_x$), and a silicon oxynitride ($SiO_xN_y$). A portion or an entire portion of the buffer layer BF may be omitted is some implementations of this embodiment.

The semiconductor layer ACT is disposed on the buffer layer BF. The semiconductor layer ACT may include at least one of polysilicon and an oxide semiconductor. The semiconductor layer ACT includes a channel region C, a first region P, and a second region Q. The first region P and the second region Q are disposed at opposite sides of the channel region C, respectively. The channel region C may be doped with a small amount of impurities or may be a semiconductor that is not doped with impurities, and the first region P and the second region Q may include a semiconductor doped with a large amount of impurities compared to the channel region C. The semiconductor layer ACT may be formed by using an oxide semiconductor, and in this case, a separate protective layer may be added to protect an oxide semiconductor material that is vulnerable to external environments such as a high temperature.

A first insulating layer IL1 may be disposed on the semiconductor layer ACT. A gate electrode GE is positioned on the first insulating layer IL1.

The gate electrode GE may be a single layer or a multilayer in which a metal layer including any one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region C of the semiconductor layer ACT.

A second insulating layer IL2 may be positioned on the gate electrode GE and the first insulating layer IL1. The first insulating layer IL1 and the second insulating layer IL2 may be a single layer or multiple layers including at least one of inorganic insulating materials such as a silicon oxide, a silicon nitride, a silicon oxynitride, an aluminum oxide, a titanium oxide, a tantalum oxide, or a hafnium oxide.

A source electrode SE and a drain electrode DE are positioned on the second insulating layer IL2. The source electrode SE and the drain electrode DE are respectively connected to the first region P and the second region Q of the semiconductor layer ACT through contact holes formed in the first insulating layer IL1 and the second insulating layer IL2.

The source electrode SE and the drain electrode DE may include a conductive material including molybdenum (Mo), aluminum (Al), copper (Cu), titanium (Ti), and the like, and may be formed as a multilayer or a single layer including the above materials. In an embodiment, the source electrode SE and the drain electrode DE may have a multi-layer structure (Ti/Al/Ti) of a titanium layer, an aluminum layer, and a titanium layer.

A third insulating layer IL3 is disposed on the source electrode SE and the drain electrode DE. A first electrode E1 may be positioned on the third insulating layer IL3.

The first electrode E1 may include a metal such as silver (Ag), lithium (Li), calcium (Ca), aluminum (Al), magnesium (Mg), and gold (Au), and may also include a transparent conductive oxide (TCO) such as an indium zinc oxide (IZO) and an indium tin oxide (ITO).

The first electrode E1 may be formed as a single layer including a metal material or a transparent conductive oxide, or a multiple layer including the same. For example, the first electrode E1 may have a triple layer structure of a first layer including an indium tin oxide (ITO), a second layer including silver (Ag), and a third layer including an indium tin oxide (ITO).

A fourth insulating layer IL4 is disposed on the first electrode E1. The fourth insulating layer IL4 overlaps at least a portion of the first electrode E1. The fourth insulating layer IL4 has an opening defining an emission region. For example, a width of the opening exposing an upper surface of the first electrode E1 may correspond to a width of the emission region from which light is emitted or a width of the pixel. The opening may have a rhombus or octagonal shape that is similar to a rhombus in a plan view, but the present invention is not limited thereto, and may have any shape such as a quadrangle, a polygon, a circle, or an oval.

The third insulating layer IL3 and the fourth insulating layer IL4 may include a general purpose polymer such as poly(methyl methacrylate) (PMMA) or polystyrene (PS), a polymer derivative having a phenolic group, or an organic insulating material such as an acrylic polymer, an imide polymer, a polyimide, an acrylic polymer, a siloxane polymer, etc.

An emission layer EL may be disposed on the first electrode E1. The emission layer EL may include an organic material and/or an inorganic material. The emission layer EML1 may generate a predetermined color light.

A second electrode E2 is positioned on the emission layer EL. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), etc., or a transparent conductive oxide (TCO) such as an indium tin oxide (ITO) or an indium zinc oxide (IZO).

The first electrode E1, the emission layer EL, and the second electrode E2 may constitute a light emitting diode ED. Herein, the first electrode E1 may be an anode which is a hole injection electrode, and the second electrode E2 may be a cathode which is an electron injection electrode. However, the embodiment described herein is not limited thereto, and the first electrode E1 may be a cathode and the second electrode E2 may be an anode depending on a driving method of an emissive display device.

When holes and electrons are injected from the first electrode E1 and the second electrode E2 into the emission layer (EL), excitons formed by combining the injected holes and electrons are emitted when they fall from an excited state to a ground state.

An encapsulation layer ENC may be disposed on the second electrode E2. The encapsulation layer ENC may cover and seal not only the upper surface of the light emitting element but also the side surfaces. Since the light emitting diode LD is very vulnerable to moisture and oxygen, the encapsulation layer ENC seals the light emitting element to block inflow of moisture and oxygen from the outside.

The encapsulation layer ENC may include a plurality of layers, and among them, may be formed of a composite film including both an inorganic layer and an organic layer, and for example, may be formed as a triple layer in which a first inorganic encapsulation layer EIL1, an encapsulation organic layer EOL, and a second inorganic encapsulation layer EIL2 are sequentially formed.

A signal line VL may be positioned on the second insulating layer IL2 in the non-display area PA. A portion of the signal line VL may be exposed by the third insulating layer IL3. According to an example, the signal line VL may be electrically connected to the second electrode E2 through an auxiliary pattern AP. Although the embodiment is shown in which the signal line VL is connected to the second electrode E2 through the auxiliary pattern AP, the embodiment described herein is not limited thereto, and the signal line VL may be in direct contact with the second electrode E2.

According to an embodiment, the signal line VL may be formed by using a same material as that of the source electrode SE and the drain electrode DE. For example, the signal line VL may have a stacked structure of a first layer including titanium (Ti), a second layer including aluminum (Al), and a third layer including titanium (Ti). In addition, the auxiliary pattern AP may be formed in a same process using a same material as those of the first electrode E1. For example, the auxiliary pattern AP may have a stacked structure of a first layer including an ITO, a second layer including Ag, and a third layer including an ITO.

Hereinafter, a method of manufacturing the first electrode positioned in the display area DA and the signal line VL positioned in the non-display area PA will be described with reference to FIG. 6 to FIG. 9. FIG. 6 to FIG. 9 illustrate only some components positioned on the substrate SUB.

Figure 6:
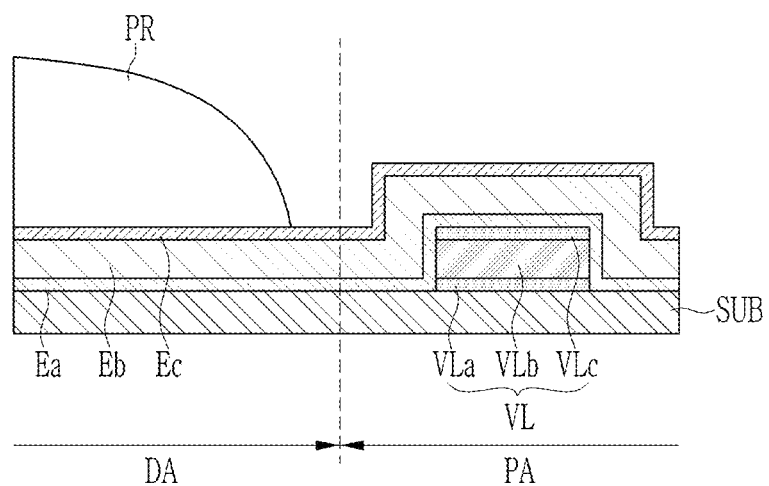
FIG. 6, FIG. 7, FIG. 8, and FIG. 9 illustrate cross-sectional views showing an etching process according to examples.

First, referring to FIG. 6, the signal line VL positioned in the non-display area PA may include a first layer VLa, a second layer VLb, and a third layer VLc. As illustrated in FIG. 5, the signal line VL is positioned on a same layer as that of the source electrode SE and the drain electrode DE, and may include a same material. For example, the first layer VLa may include titanium, the second layer VLb may include aluminum, and the third layer VLc may include titanium.

Conductive layers Ea, Eb, and Ec as a triple layer and a mask pattern PR may be formed on the display area DA and the non-display area PA in order to form the first electrode. The conductive layers Ea, Eb, and Ec may overlap the signal line VL. In this case, the first conductive layer Ea and the third conductive layer Ec may include an ITO, and the second conductive layer Eb may include Ag.

Figure 7:
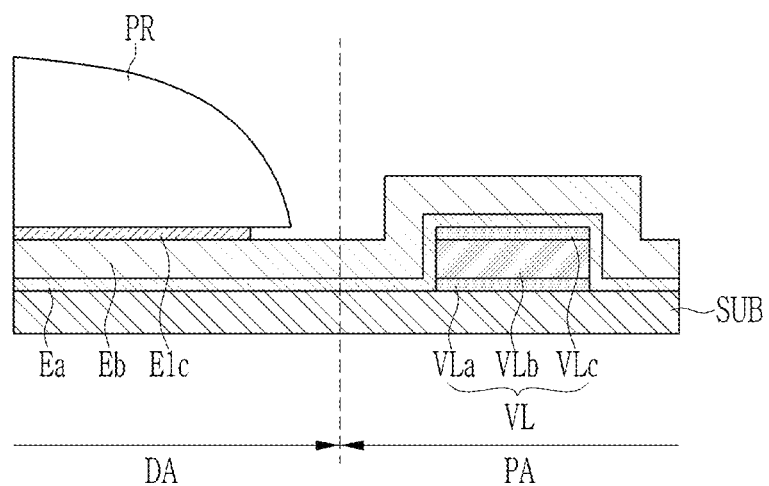
Figure 8:
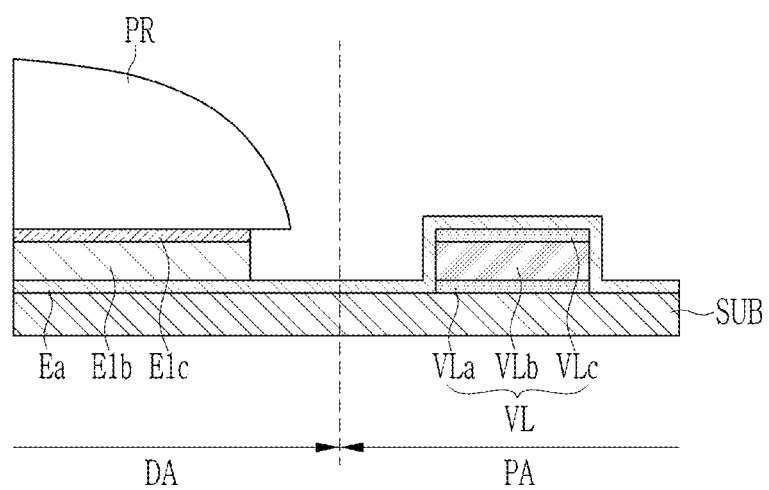
Figure 9:
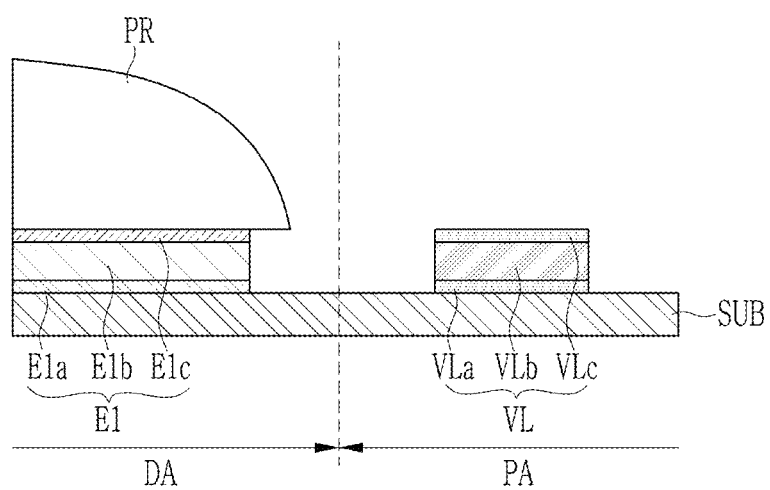

As illustrated in FIG. 7, the third conductive layer Ec may be etched into a third conductive pattern E1c by using the mask pattern PR. Thereafter, as illustrated in FIG. 8, the second conductive layer Eb may be etched into a second conductive pattern E1b by using the etchant composition described above. Again, as illustrated in FIG. 9, the first conductive layer Ea may be etched into a first conductive pattern E1a by using an etchant of the ITO metal layer. The first to third conductive patterns E1a, E1b, and E1c may form the first electrode E1 described above with reference to FIG. 5.

Figure 10:
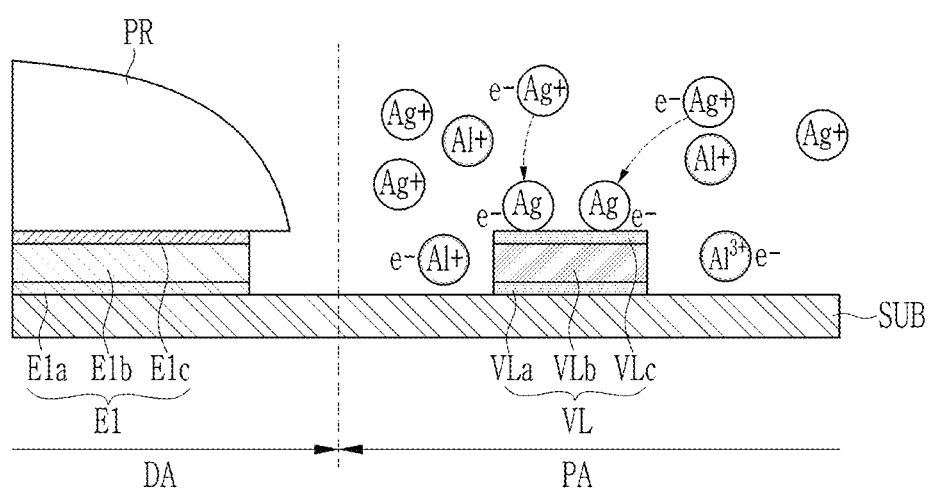
FIG. 10 and FIG. 11 illustrate cross-sectional views showing an etching process according to comparative examples.
Figure 11:
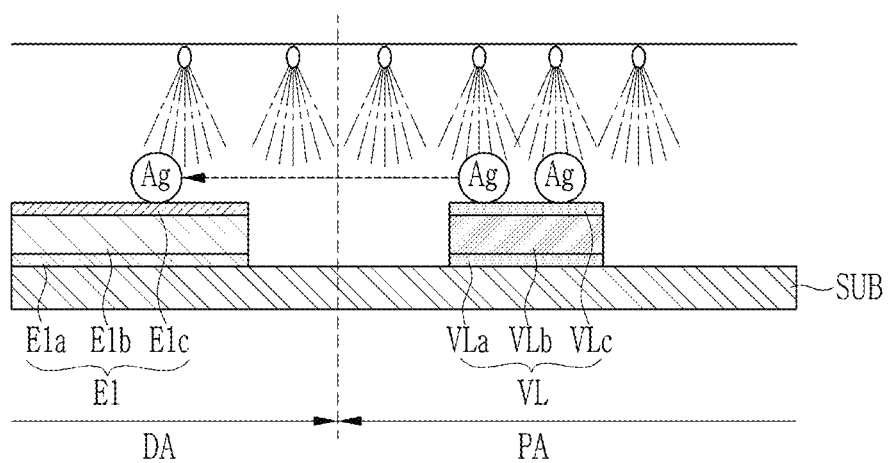

Next, a process of forming the first electrode using the etchant composition according to the comparative example will be described with reference to FIG. 10 and FIG. 11. FIG. 10 and FIG. 11 also illustrated only some components positioned on the substrate SUB, and descriptions of the same and similar components as those described above will be omitted for ease in explanation of these figures.

According to the comparative example, when using the etchant composition containing the phosphoric acid-based compound or etching the multilayer film in a batch, Ag ions may be generated in a process of patterning the conductive patterns E1a, E1b, and E1c including ITO/Ag/ITO as illustrated in FIG. 10. The etchant composition according to the comparative example may reduce Ag ions into Ag particles by receiving electrons generated from the second layer VLb including aluminum during contact with the exposed signal line VL.

As illustrated in FIG. 11, the reduced silver (Ag) particles may move from the non-display area PA to the display area DA by a physical or chemical cleaning process from a process of removing a mask pattern to a process of depositing other components. The silver (Ag) particles moving to the display area DA may penetrate the light emitting diode or the thin film transistor. There may be a problem in that a dark portion is generated in the display area DA due to the silver (Ag) particles.

A non-phosphoric acid-based compound may be used as in the etchant composition according to an embodiment in order to prevent such a silver reducing particle precipitation phenomenon. In addition, it is possible to prevent an Al-containing layer from being exposed to the etchant composition in a process in which the Ag-containing layer is etched by etching each layer without batch etching multiple layers.

That is, since the etchant composition according to the embodiments described hereinabove contains no phosphoric acid, it is possible to prevent damage to signal lines such as signal lines exposed in the non-display area. In addition, although the phosphoric acid-based compound is not included, proper etching ability may be obtained by including the lactate-based compound. In addition, the sulfate-based compound generally used for ITO etching may not be included in order to selectively etch only the metal layer including silver (Ag).

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An etchant composition comprising:
an inorganic acid compound at 9.0 wt % to 9.9 wt %;
an inorganic salt compound at 5.0 wt % to 10.0 wt %;
an organic acid compound at 35 wt % to 45 wt %;
a lactate-based compound at 10 wt % to 20 wt %;
a nitrogen cyclic compound containing oxygen at 0.1 wt % to 1.0 wt %; and
a remaining amount of water such that a total weight of the etchant composition is 100 wt %,
wherein the inorganic acid compound is an etchant composition having an acid dissociation constant (pKa) value of −1.0 to −3.0.

2. The etchant composition of claim 1, wherein
the lactate-based compound includes at least one of mandelic acid ($C_8H_8O_3$), phenylacetic acid ($C_8H_8O_2$), valeric acid ($C_5H_{10}O_2$), lauric acid ($C_{12}H_{24}O_2$), propionic acid ($C_3H_6O_2$), butyric acid ($C_3H_7COOH$), glycolic acid ($C_2H_4O_3$), sodium lactate ($C_3H_5NaO_3$), 3-hydroxypropionic acid ($C_3H_6O_3$), or lactic acid ($C_3H_6O_3$).

3. The etchant composition of claim 1, wherein
the inorganic salt compound has a reduction potential value of 0.5 V to 1.0 V.

4. The etchant composition of claim 1, wherein
the nitrogen cyclic compound containing oxygen includes at least one of uric acid ($C_5H_4N_4O_3$), iprodione ($C_{13}H_{13}Cl_2N_3O_3$), cytosine ($C_4H_5N_3O$), guanine ($C_5H_5N_5O$), thymine ($C_5H_6N_2O_2$), hydantoin ($C_3H_4N_2O_2$), oxazole ($C_3H_3NO$), 1H-benzotriazole-1-methanol ($C_7H_7N_3O$), 3-nitro-1H-1,2,4-triazole ($C_2H_2N_4O_2$), benzoxazole ($C_7H_5NO$), isothiazolinone ($C_3H_3NOS$), succinimide ($C_4H_5NO_2$) or glutarimide ($C_5H_7NO_2$).

5. The etchant composition of claim 1, wherein
the inorganic acid compound includes at least one of nitric acid ($HNO_3$), sulfuric acid ($H_2SO_4$), p-toluenesulfonic acid ($CH_3C_6H_4SO_3$), or chloric acid ($HClO_3$).

6. The etchant composition of claim 1, wherein
the inorganic salt compound includes at least one of ammonium nitrate ($NH_4NO_3$), sodium nitrate ($NaNO_3$), potassium nitrate ($KNO_3$), copper nitrate ($Cu(NO_3)_2$), ferric nitrate ($Fe(NO_3)_3$), magnesium nitrate ($Mg(NO_3)_2$), or zinc nitrate ($ZnNO_3$).

7. The etchant composition of claim 1, wherein
the etchant composition includes at least two different inorganic salt compounds.

8. The etchant composition of claim 1, wherein
the organic acid compound includes at least one of acetic acid ($CH_3CO_2H$), malic acid ($C_4H_6O_5$), citric acid ($C_6H_8O_7$), tartaric acid ($C_4H_6O_6$), formic acid ($CH_2O_2$), succinic acid ($C_4H_6O_4$), fumaric acid ($C_4H_4O_4$), sulfonic acid ($CH_4O_3S$), methane sulfonic acid ($CH_3SO_3H$), aminomethylsulfonic acid ($CH_5NO_3S$), or sulfamic acid ($H_3NSO_3$).

9. The etchant composition of claim 1, wherein
the etchant composition includes at least two or more different organic acid compounds.

10. The etchant composition of claim 1, wherein
a weight ratio of the inorganic salt compound to the nitrogen cyclic compound containing oxygen is 1:0.02 to 1:0.2.

11. The etchant composition of claim 1, wherein
a weight ratio of the lactate-based compound to the nitrogen cyclic compound containing oxygen is 1:0.005 to 1:0.1.

12. A manufacturing method of a display device, comprising:
forming a transistor on a substrate;
forming a first electrode to be electrically connected to the transistor,
wherein the first electrode has a stacked structure of a first conductive layer, a second conductive layer containing silver (Ag), and a third conductive layer; and
etching the second conductive layer by use of an etchant composition,
wherein the etchant composition includes:
an inorganic acid compound at 9.0 wt % to 9.9 wt %; and
an inorganic salt compound at 5.0 wt % to 10.0 wt %;
an organic acid compound at 35 wt % to 45 wt %; a lactate-based compound at 10 wt % to 20 wt %; a nitrogen cyclic compound containing oxygen at 0.1 wt % to 1.0 wt %; and a remaining amount of water such that a total weight of the etchant composition is 100 wt %, and
wherein the inorganic acid compound is an etchant composition having an acid dissociation constant (pKa) value of −1.0 to −3.0.

13. The manufacturing method of claim 12, wherein
the substrate includes a display area and a non-display area,
the manufacturing method of the display device further includes forming a signal line positioned on the non-display area, and
the signal capacitor includes:
a first layer containing titanium;
a second layer containing aluminum; and
a third layer containing titanium.

14. The manufacturing method of claim 12, wherein
the first conductive layer and the third conductive layer include an ITO, and
are not etched by the etchant composition.

15. The manufacturing method of claim 12, wherein
the lactate-based compound includes at least one of mandelic acid ($C_8H_8O_3$), phenylacetic acid ($C_8H_8O_2$), valeric acid ($C_5H_{10}O_2$), lauric acid ($C_{12}H_{24}O_2$), propionic acid ($C_3H_6O_2$), butyric acid ($C_3H_7COOH$), glycolic acid ($C_2H_4O_3$), sodium lactate ($C_3H_5NaO_3$), 3-hydroxypropionic acid ($C_3H_6O_3$), or lactic acid ($C_3H_6O_3$), and the lactate-based compound is included at 10 to 20 wt % based on a total weight of the etchant composition.

16. The manufacturing method of claim 12, wherein
the nitrogen cyclic compound containing oxygen includes at least one of uric acid ($C_5H_4N_4O_3$), iprodione ($C_{13}H_{13}Cl_2N_3O_3$), cytosine ($C_4H_5N_3O$), guanine ($C_5H_5N_5O$), thymine ($C_5H_6N_2O_2$), hydantoin ($C_3H_4N_2O_2$), oxazole ($C_3H_3NO$), 1H-benzotriazole-1-methanol ($C_7H_7N_3O$), 3-nitro-1H-1,2,4-triazole ($C_2H_2N_4O_2$), benzoxazole ($C_7H_5NO$), isothiazolinone ($C_3H_3NOS$), succinimide ($C_4H_5NO_2$), or glutarimide ($C_5H_7NO_2$).

17. The manufacturing method of claim 12, wherein
the inorganic acid compound includes at least one of nitric acid ($HNO_3$), sulfuric acid ($H_2SO_4$), p-toluenesulfonic acid ($CH_3C_6H_4SO_3$), or chloric acid ($HClO_3$).

18. The manufacturing method of claim 12, wherein the inorganic salt compound includes at least one of ammonium nitrate ($NH_4NO_3$), sodium nitrate ($NaNO_3$), potassium nitrate $KNO_3$), copper nitrate ($Cu(NO_3)_2$), ferric nitrate ($Fe(NO_3)_3$), magnesium nitrate ($Mg(NO_3)_2$), or zinc nitrate ($ZnNO_3$).

19. The manufacturing method of claim 12, wherein the organic acid compound includes at least one of acetic acid ($CH_3CO_2H$), malic acid ($C_4H_6O_5$), citric acid ($C_6H_8O_7$), tartaric acid ($C_4H_6O_6$), formic acid ($CH_2O_2$), succinic acid ($C_4H_6O_4$), fumaric acid ($C_4H_4O_4$), sulfonic acid ($CH_4O_3S$), methane sulfonic acid ($CH_3SO_3H$), aminomethylsulfonic acid ($CH_5NO_3S$), or sulfamic acid ($H_3NSO_3$).

20. The manufacturing method of claim 12, wherein the inorganic salt compound has a reduction potential value of 0.5 V to 1.0 V.

\* \* \* \* \*